United States Patent
Keller

(10) Patent No.: US 6,788,160 B2
(45) Date of Patent: Sep. 7, 2004

(54) OSCILLATOR CIRCUIT CONNECTED TO A VOLTAGE SOURCE PROVIDING A SUBSTANTIALLY CONSTANT SUPPLY VOLTAGE

(75) Inventor: Thomas Keller, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/216,601

(22) Filed: Aug. 9, 2002

(65) Prior Publication Data

US 2003/0048144 A1 Mar. 13, 2003

(30) Foreign Application Priority Data

Aug. 9, 2001 (DE) .......................... 101 39 112

(51) Int. Cl.[7] ................................. H03B 1/00
(52) U.S. Cl. ........................ 331/177 V; 331/177 R; 331/36 R
(58) Field of Search .................. 331/177 V, 117 R, 331/36 R, 36 C, 16, 17

(56) References Cited

U.S. PATENT DOCUMENTS

| | | | | |
|---|---|---|---|---|
| 4,716,383 A | * | 12/1987 | Lofgren et al. | ........ 331/117 FE |
| 5,034,703 A | * | 7/1991 | Schumacher | .................... 331/2 |
| 5,051,613 A | * | 9/1991 | Houser et al. | ............... 327/544 |
| 5,434,543 A | * | 7/1995 | Brilka et al. | ............. 331/117 R |
| 5,602,513 A | * | 2/1997 | De Loe, Jr. | .................... 331/25 |
| 5,640,111 A | * | 6/1997 | Hasegawa | .................... 327/122 |
| 5,900,788 A | * | 5/1999 | Hagemeyer | ............. 331/117 R |
| 6,127,900 A | * | 10/2000 | Laub et al. | .................. 331/179 |
| 6,229,401 B1 | * | 5/2001 | Wilber | ......................... 331/20 |

* cited by examiner

Primary Examiner—Timothy P. Callahan
Assistant Examiner—An T. Luu
(74) Attorney, Agent, or Firm—W. Daniel Swayze, Jr.; W. James Brady; Frederick J. Telecky, Jr.

(57) ABSTRACT

The invention relates to a voltage-controlled oscillator circuit including an oscillator circuit connected to a voltage source furnishing a substantially constant supply voltage, and comprising at least one varactor, and a control voltage generator circuit whose output is connected to the anode of the varactor, the frequency of the oscillation signal of the oscillator circuit being variable by changing the control voltage. A voltage converter circuit and an ON/OFF switch therefor is located between the voltage source and the oscillator circuit, the conversion factor of the voltage converter circuit being selected so that a wide tuning range of the varactor and thus a wide frequency range of the oscillation signal is available. The invention can be put to use, for example, in a phase-locked loop. The oscillator circuit may be powered by a fixed predefined battery voltage.

10 Claims, 2 Drawing Sheets

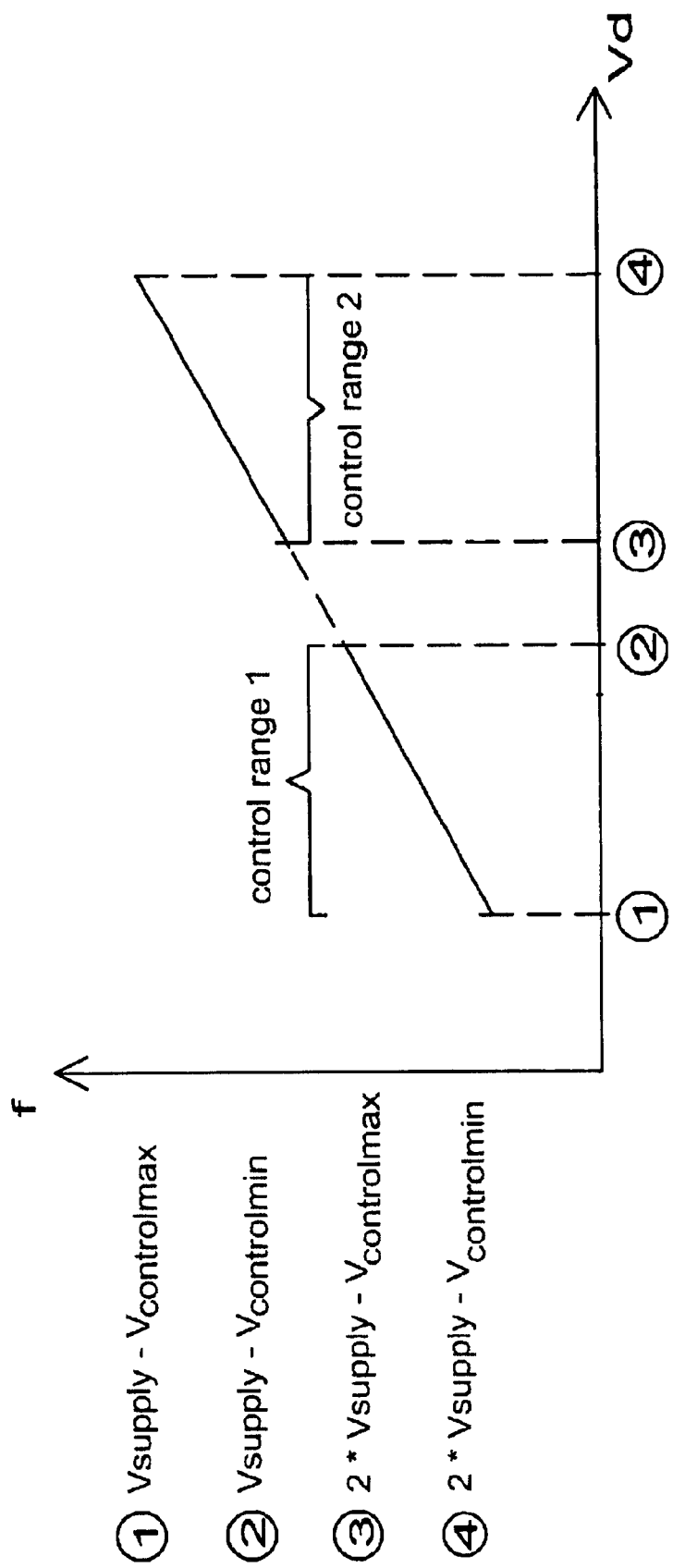

OSCILLATOR CIRCUIT CONNECTED TO A VOLTAGE SOURCE PROVIDING A SUBSTANTIALLY CONSTANT SUPPLY VOLTAGE

FIELD OF THE INVENTION

The invention relates to a voltage-controlled oscillator (VCO) circuit including an oscillator circuit connected to a voltage source furnishing a substantially constant supply voltage, and comprising at least one varactor, and a control voltage generator circuit whose output is connected to the anode of the varactor, the frequency of the oscillation signal of the oscillator circuit being variable by changing the control voltage.

BACKGROUND OF THE INVENTION

Voltage-controlled oscillator circuits, configured integrated as a rule—as used for example in phase-locked loops—are known in prior art. They are often powered by fixedly predefined battery voltages. Since the trend in electronics is to continually reduce standard battery voltages this poses a problem in such circuitry by the reduction in the supply voltage making it increasingly more difficult to achieve an adequate tuning range of the varactor and thus the frequency range of the oscillation signal.

Another possibility of achieving the oscillator circuitry would be to completely change the circuit configuration by grounding the anode of the varactor. However, this would necessitate additional circuit modules such as blocking capacitors and resistors, which in turn diminish the tuning range and on top of this, would have a negative effect on the phase noise and current consumption.

SUMMARY OF THE INVENTION

An objective of the present invention is thus to provide a voltage-controlled oscillator circuit which even in conjunction with small, substantially constant, supply voltages, as furnished by batteries, can still be put to use whilst achieving low phase noise, low current consumption and a wide tuning range.

This objective is satisfied by the voltage-controlled oscillator circuit as cited at the outset in which a voltage converter circuit and an ON/OFF switch therefor is located between the voltage source and the oscillator circuit, the conversion factor of the voltage converter circuit being selected so that a wide tuning range of the varactor and thus a wide frequency range of the oscillation signal is available.

The invention features several advantages. Thus, the complete configuration of a voltage-controlled oscillator circuit as used hitherto can continue to be used, more particularly enabling the control voltage generator circuit to be taken over with no change, i.e. only additional components needing to be added without requiring any change to already existing components. Since good filtering of the signal of the voltage converter circuit is permitted, any increase in phase noise is avoided. Due to relatively high (blocking) voltages always existing across the varactor when using the voltage converter circuit, any noise and hum existing has only a minor effect on the output signal of the oscillator circuit. In addition, the voltage-controlled oscillator can continue to be powered by a defined supply voltage. There is no need to change components or to use several voltage sources.

Unlike other oscillator circuit assemblies in which the anode of the varactor is grounded via resistors, the control range of the proposed oscillator circuit is not diminished by additional blocking capacitors. This enables the frequency range of the circuit to be significantly increased by simple and effect means for the oscillator circuit in accordance with the invention unlike such prior art circuitry.

BRIEF DESCRIPTION OF THE DRAWINGS

The invention will now be detailed with reference to the drawings in which:

FIG. 2 is a graph explaining how the oscillator circuit in accordance with the invention works by plotting the frequency of the signal of the oscillator circuit 25 as a function of the difference between the supply voltage and control voltage.

DETAILED DESCRIPTION OF THE INVENTION

Figure 1:
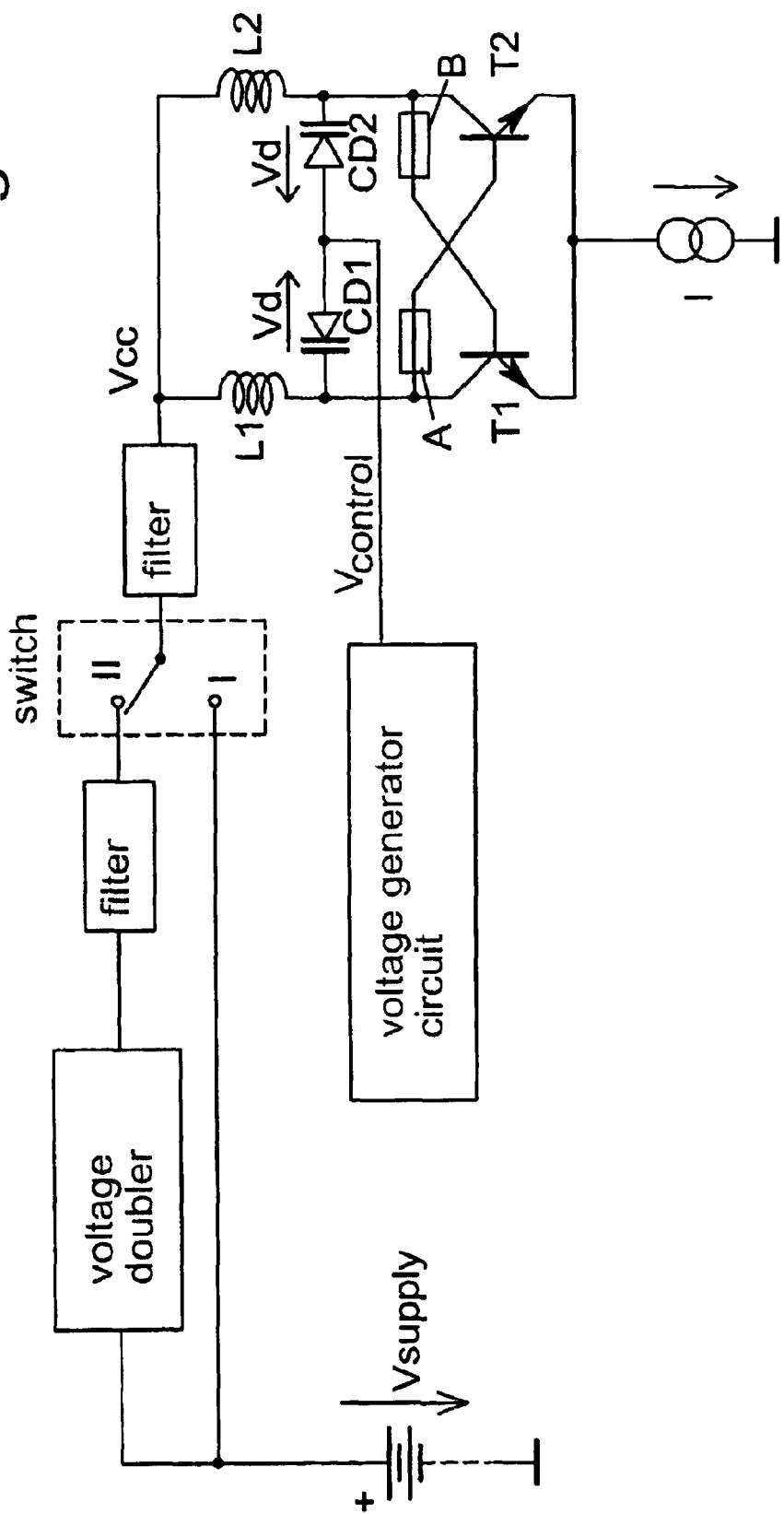
FIG. 1 is a circuit diagram of the oscillator circuit in accordance with the invention including a voltage converter circuit and a switch for selecting ON/OFF thereof.

Referring now to FIG. 1 there is illustrated a circuit diagram depicting a preferred embodiment of the voltage-controlled oscillator circuit in accordance with the invention, the configuration of which will now be described.

In the embodiment as shown in this case, the circuit comprises an oscillator circuit made up of inductances L1 and L2 and the varactors CD1 and CD2 respectively. Each of the inductances L1 and L2 are connected to each other by one end and to the supply voltage. The free end of L1 and L2 respectively is connected to the cathode of CD1 and CD2 respectively. In addition, the anodes of the varactors CD1 and CD2 respectively are connected to each other. The cathode of the varactor CD1 is connected to the collector of a transistor T1, the cathode of varactor CD2 to the collector of a transistor T2. The collector of the transistor T1 is furthermore connected to the base of transistor T2, the collector of transistor T2 to the base of transistor T1. Instead of the direct connections between the transistors, components such as capacitors or amplifiers may be inserted at the locations A and B as an alternative or in addition thereto. The emitters of the transistors T1, T2 are connected to each other and via a current source I to ground.

The configuration of the transistors T1 and T2, as described above, is known to the person skilled in the art as an emitter-coupled amplifier circuit or differential amplifier, the precise function of which thus does not need to be explained. By connecting the oscillator circuit to the emitter-coupled amplifier circuit the signal of the oscillator circuit is amplified and a signal having a defined frequency f is output at the collector of the transistors T1 and T2. Employing an emitter-coupled amplifier in an oscillator circuit is particularly advantageous since it permits a particularly simple and compact configuration.

The anodes of the varactors CD1 and CD2 are furthermore connected to a control voltage Vcontrol furnished by a control voltage generator circuit, which may be e.g. a charge pump (synthesizer) of a phase-locked loop. The symmetrical configuration of the oscillator circuit is especially advantageous for simply decoupling the control voltage. The connection between the two inductances L1 and L2 is furthermore connected to an input voltage Vcc.

When the switch as shown in FIG. 1 is in the position I, the input voltage Vcc is then directly furnished by a supply voltage source (battery), Vsupply.

When the switch as shown in FIG. 1 is in the position II, the voltage of the battery is doubled by the voltage doubler and then applied to the oscillator circuit (2* Vsupply=Vcc).

It is particularly advantageous when, as shown in FIG. 1, filters are inserted upstream and downstream of the switch in enabling e.g. the output signal of a voltage doubler consisting of a charge pump to be suitably filtered.

The function of the circuit as shown in FIG. 1 will now be described.

In first considering the case in which the voltage source directly furnishes the input voltage Vcc, i.e. with the switch in the position I, where Vcc=Vsupply, the voltage at the oscillator circuit is then $$Vd = Vcc - Vcontrol = Vsupply - Vcontrol \quad (1)$$

The capacitances C1, C2 of the varactors CD1, CD2 depend on the voltage Vd applied thereto. The inductances L1 and L2 as well as the varactors CD1 and CD2 in this case are assumed to be identical in this circuit, i.e. L=L1=L2 and C=C1=C2=C(Vd). The frequency f of the oscillator circuit is then given by $$f = 1/[2*\pi*(L*C(Vd))^{1/2}] \quad (2)$$

or with (1) by $$f = 1/[2*\pi*(L*C(Vsupply - Vcontrol))^{1/2}] \quad (3)$$

When the inductance L and supply voltage Vsupply are fixed the frequency f of the oscillator circuit is then just a function of the control voltage Vcontrol.

When the switch is in the position II, the voltage doubler results in the input voltage assuming the value Vcc=2*Vsupply and via the oscillator circuit the voltage $$Vd = Vcc - Vcontrol = 2*Vsupply - Vcontrol \quad (4)$$

is applied. With (2) the frequency f of the oscillator circuit then becomes $$f = 1/[2*\pi*(L*C(2*Vsupply - Vcontrol))^{1/2}] \quad (5)$$

and thus by suitably selecting the varactors CD1 and CD2 an additional frequency range for the output signal of the oscillator achieved.

Referring now to FIG. 2 there is illustrated the plot of the frequency f of the oscillator as a function of voltage Vd applied to the oscillator circuit for a preferred embodiment of the invention.

Depending on the type of varactor involved, the capacitance C depends on the applied voltage Vd in different ways. In one preferred embodiment of the invention a varactor is selected which in the range under consideration can be described by the formula $$C = k*Vd^{-2} \quad (6)$$

where k is a constant. As will be shown in the following, this type of varactor is particularly advantageous, because the frequency of the oscillator is then a linear function of the control voltage.

The frequency f of the oscillator obeys in using (2) and (6) the relationship $$f = Vd/[2*\pi*(k*L)^{1/2}] \quad (7)$$

For a fixed inductance L and constant k the frequency f of the oscillator circuit is thus only a linear function of the voltage Vd applied to the varactor.

Operating the oscillator circuit in the switch position I and setting (1) in (7) results in $$f = [Vsupply - Vcontrol]/[2*\pi*(k*L)^{1/2}] \quad (8)$$

The limits of the control range of the frequency f are thus determined for a given supply voltage Vsupply by the maximum control voltage Vcontrolmax and the minimum control voltage Vcontrolmin and the oscillator can cover a frequency range of [Vsupply−Vcontrolmax]/[2*π* (k*L)$^{1/2}$] to [Vsupply−Vcontrolmin]/[2*π* (k*L)$^{1/2}$] as is illustrated in FIG. 2 as control range 1.

Operating the oscillator circuit in the switch position II and selecting a varactor of the type in accordance with (6) results in the frequency f of the oscillator obeying in employing (4) and (7) the relationship $$f = [2*Vsupply - Vcontrol]/[2*\pi* (k*L)^{1/2}] \quad (9)$$

In switch position II the oscillator thus covers a frequency range of [2*Vsupply−Vcontrolmax]/[2*π* (k*L)$^{1/2}$] to [2*Vsupply−Vcontrolmin]/[2*π* (k*L)$^{1/2}$], illustrated in FIG. 2 as control range 2. It is evident that the voltage doubler permits a particularly advantageous expansion of the control range of the voltage-controlled oscillator, since by suitably selecting Vcontrolmax and Vcontrolmin it can be disposed near anywhere within certain limits and thus is also able to adjoin almost continually the original control range 1.

The oscillator circuit in accordance with the invention can be employed, for example, as a VCO in a phase-locked loop.

What is claimed is:

1. A voltage-controlled oscillator circuit including an oscillator circuit connected to a voltage source furnishing a substantially constant supply voltage, and comprising at least one varactor, and a control voltage generator circuit whose output is connected to the anode of the varactor, the frequency of the oscillation signal of the oscillator circuit being variable by changing the control voltage, wherein a voltage converter circuit and an ON/OFF switch therefor is located between said voltage source and said oscillator circuit, the conversion factor of said voltage converter circuit being selected so that a wide tuning range of said varactor and thus a wide frequency range of said oscillation signal is available, wherein said voltage converter circuit is a voltage doubler.

2. The voltage-controlled oscillator circuit as set forth in claim 1, wherein said oscillator circuit comprises two varactors whose anodes are connected to each other.

3. The voltage-controlled oscillator circuit as set forth in claim 1, wherein said varactor is configured so that its capacitance is indirectly proportional to the square of the voltage applied across said varactor.

4. The voltage-controlled oscillator circuit as set forth in claim 1, wherein said oscillator circuit comprises two inductances.

5. The voltage-controlled oscillator circuit as set forth in claim 1, wherein said voltage doubler is configured in the form of a charge pump circuit.

6. The voltage-controlled oscillator circuit as set forth in claim 1, wherein a filter is connected between said voltage converter circuit and said switch.

7. The voltage-controlled oscillator circuit as set forth in claim 1, wherein a filter is connected between oscillator circuit and said switch.

8. The voltage-controlled oscillator circuit as set forth in claim 1, wherein said oscillator circuit comprises furthermore an emitter-coupled differential amplifier circuit which amplifies the oscillation signal of said oscillator circuit.

9. The voltage-controlled oscillator circuit as set forth in claim 1, wherein said voltage source is a battery.

10. The voltage-controlled oscillator circuit as set forth in claim 1, which is configured in the form of an integrated circuit.

* * * * *